(12) United States Patent  
Hayase

(10) Patent No.: US 10,186,475 B2  
(45) Date of Patent: Jan. 22, 2019

(54) INSULATED BUSBAR, INSULATED BUSBAR FABRICATION METHOD, AND ELECTRONIC APPARATUS

(71) Applicant: FUJI ELECTRIC CO., LTD., Kawasaki-shi, Kanagawa (JP)

(72) Inventor: Yuji Hayase, Akishima (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 58 days.

(21) Appl. No.: 15/402,314

(22) Filed: Jan. 10, 2017

(65) Prior Publication Data

US 2017/0229379 A1 Aug. 10, 2017

(30) Foreign Application Priority Data

Feb. 10, 2016 (JP) ................. 2016-023691

(51) Int. Cl.
*H01L 23/48* (2006.01)
*H02G 5/00* (2006.01)
*H01L 21/48* (2006.01)

(52) U.S. Cl.
CPC .......... *H01L 23/48* (2013.01); *H01L 21/4814* (2013.01); *H02G 5/005* (2013.01)

(58) Field of Classification Search
CPC ...... H01L 23/48; H01L 21/4814; H02G 5/005
USPC ......................................... 257/773; 174/68.2
See application file for complete search history.

(56) References Cited

U.S. PATENT DOCUMENTS

| 3,264,403 | A | * | 8/1966 | Erdle | H02G 5/005 |
| | | | | | 174/117 FF |
| 5,808,240 | A | * | 9/1998 | Czerwinski | H01L 23/66 |
| | | | | | 174/149 B |
| 9,979,173 | B2 | * | 5/2018 | Benavides | H02G 5/005 |

FOREIGN PATENT DOCUMENTS

| JP | 2010-274602 A | 12/2010 |
| JP | 2010-274603 A | 12/2010 |
| JP | 4618211 B2 | 1/2011 |

* cited by examiner

*Primary Examiner* — Timothy Thompson
*Assistant Examiner* — Charles Pizzuto
(74) *Attorney, Agent, or Firm* — Rabin & Berdo, P.C.

(57) ABSTRACT

An insulated busbar includes a plate conductor and insulating films which cover the plate conductor. The insulated busbar further includes conductive films which are formed on inside surfaces of the insulating films so as to be in contact with the plate conductor and which cover a vacant space between an end portion of the plate conductor and the insulating films.

11 Claims, 14 Drawing Sheets

INSULATED BUSBAR, INSULATED BUSBAR FABRICATION METHOD, AND ELECTRONIC APPARATUS

CROSS-REFERENCE TO RELATED APPLICATION

This application is based upon and claims the benefit of priority of the prior Japanese Patent Application No. 2016-023691, filed on Feb. 10, 2016, the entire contents of which are incorporated herein by reference.

BACKGROUND OF THE INVENTION

1. Field of the Invention

The embodiment discussed herein is related to an insulated busbar, an insulated busbar fabrication method, and an electronic apparatus.

2. Background of the Related Art

With electronic apparatus (such as power converters) in which semiconductor elements (such as power semiconductor elements) are used, insulated busbars may be used as wirings in order to accommodate a recent increase in the frequency of signals transmitted and received in the electronic apparatus.

A structure obtained by stacking plural plate conductors on each of which an insulating film is laminated with insulating plates (spacers) therebetween is known as one of insulated busbars. With such an insulated busbar (also referred to as a laminated busbar), as the distance between conductors diminishes, mutual inductance between them increases. As a result, inductance is reduced.

The recent progress of the development of SiC devices demands that electronic apparatus have high withstand voltages. In order to make the withstand voltage of an insulated busbar high, formerly the technique of pouring molten resin between plate conductors, preventing peeling from occurring at an adhesive interface between a conductor and the resin, and suppressing a partial discharge at a peeling part was proposed (see, for example, Japanese Laid-open Patent Publication No. 2010-274602 or No. 2010-274603). Furthermore, the technique of covering an end portion of a conductor with a thermosetting adhesive material to suppress the formation of a void (vacant space) between the conductor and an insulating film and to relax electric field concentration was proposed (see, for example, Japanese Patent No. 4618211).

However, the area of an insulated busbar used in, for example, a high power electric apparatus is large. Therefore, it is difficult to completely cover an end portion of a conductor with an insulating film for preventing the formation of a vacant space. As a result, an electric field concentrates in a vacant space and a partial discharge occurs. Repeated discharges cause unintended generation of gas or deterioration of an insulating material. Accordingly, power is not transmitted stably. A high withstand voltage is realized by increasing the thickness of an insulating material between conductors. However, this causes an increase in inductance and therefore is not desirable.

As has been described, there is room for improvement in the conventional techniques for making the withstand voltage of an insulated busbar high.

SUMMARY OF THE INVENTION

According to an aspect, there is provided an insulated busbar including a plate conductor, insulating films which cover the conductor, and conductive films which are formed on inside surfaces of the insulating films so as to be in contact with the conductor and which cover vacant spaces between end portions of the conductor and the insulating films.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings.

Figure 1:
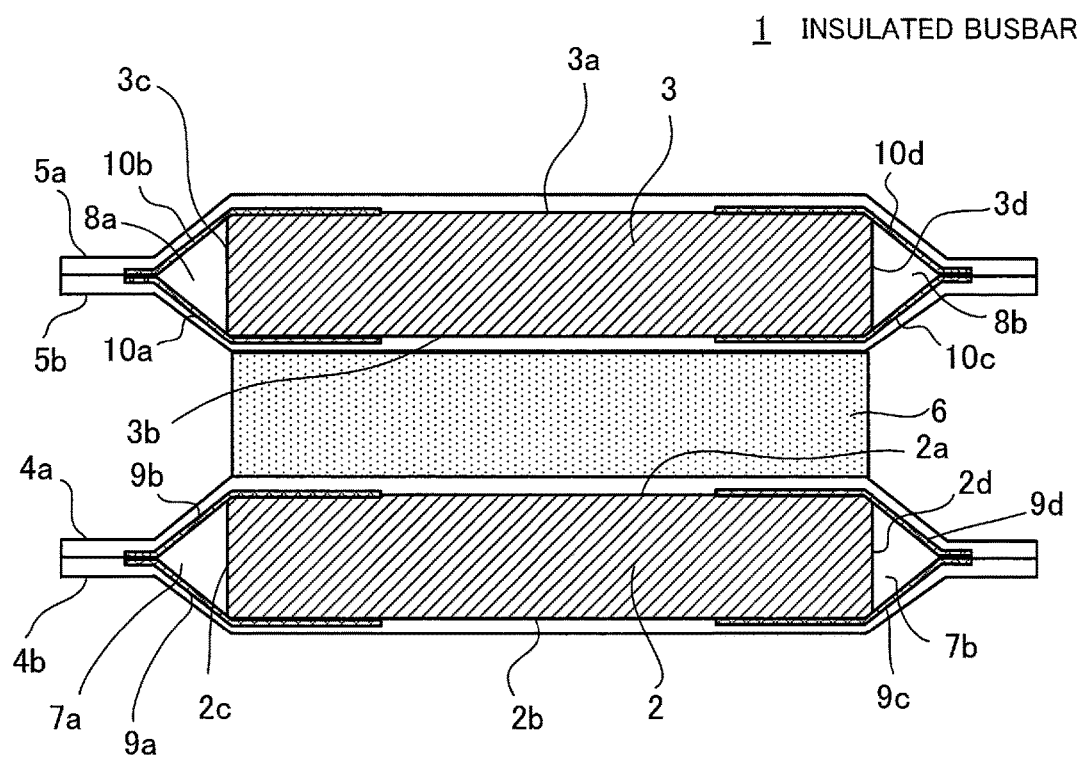
FIG. 1 is a sectional view illustrative of an example of an insulated busbar according to an embodiment.

FIG. 1 is a sectional view illustrative of an example of an insulated busbar according to an embodiment.

Figure 2:
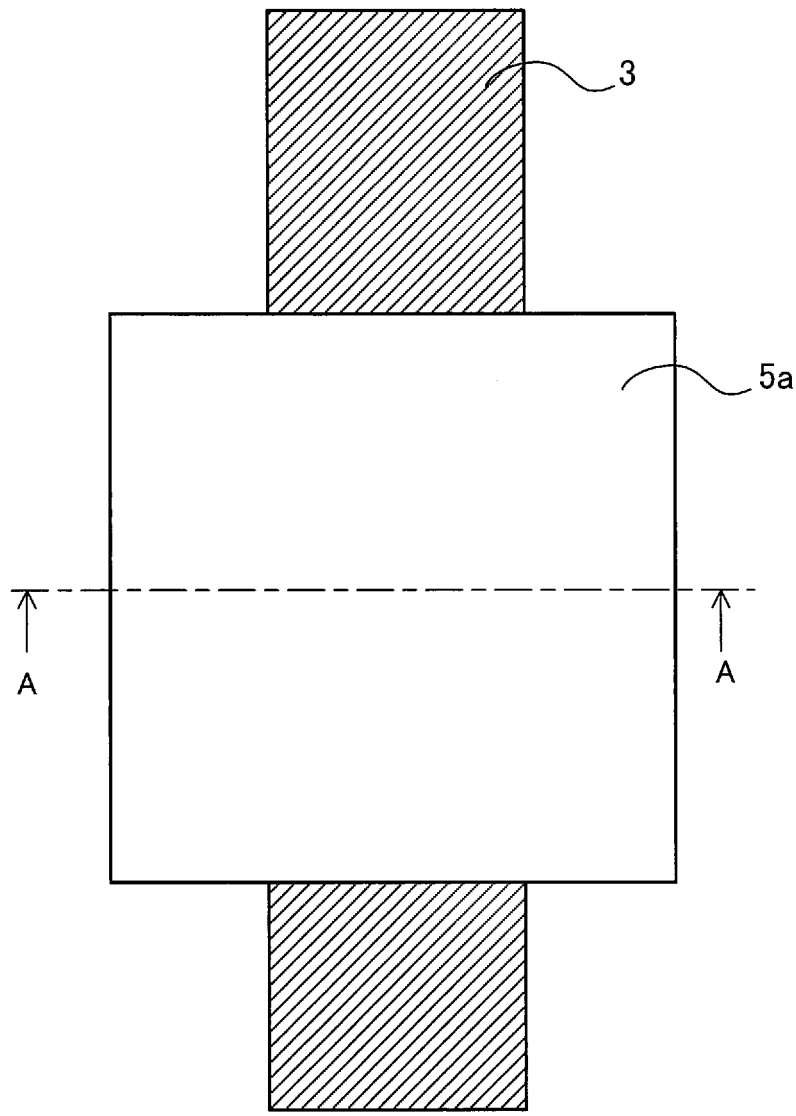
FIG. 2 is a plan view illustrative of the example of the insulated busbar according to the embodiment.

Furthermore, FIG. 2 is a plan view illustrative of the example of the insulated busbar according to the embodiment. FIG. 1 is a sectional view taken along the line A-A of FIG. 2.

An insulated busbar 1 includes plate conductors 2 and 3. The conductors 2 and 3 are, for example, copper (Cu) plates.

An upper surface 2a, an under surface 2b, and end portions 2c and 2d of the conductor 2 are covered with insulating films 4a and 4b. Similarly, an upper surface 3a, an under surface 3b, and end portions 3c and 3d of the conductor 3 are covered with insulating films 5a and 5b.

The insulating films 4a, 4b, 5a, and 5b are made of a material such as polypropylene or polyethylene terephthalate. The insulating films 4a and 4b and 5a and 5b are stuck on the conductors 2 and 3, respectively, with an adhesive (not illustrated) having thermal adhesiveness. If the insulating films 4a, 4b, 5a, and 5b have adhesive layers, then the insulating films 4a and 4b and 5a and 5b are stuck on the conductors 2 and 3, respectively, in the same way by the adhesive layers.

The conductors 2 and 3 covered in this way with the insulating films 4a and 4b and 5a and 5b, respectively, are stacked with an insulating plate 6 therebetween. For example, resin or a ceramic having a thickness of about several millimeters is used as the insulating plate 6.

In the example of FIG. 1, the insulated busbar 1 having a two-layer structure including the conductors 2 and 3 is illustrated. However, the insulated busbar 1 may have a structure in which three or more conductors are stacked.

The insulated busbar 1 according to the embodiment further includes the following conductive films.

In the example of FIG. 1, there are a vacant space 7a between the end portion 2c of the conductor 2 and the insulating films 4a and 4b and a vacant space 7b between the end portion 2d of the conductor 2 and the insulating films 4a and 4b. In addition, there are a vacant space 8a between the end portion 3c of the conductor 3 and the insulating films 5a and 5b and a vacant space 8b between the end portion 3d of the conductor 3 and the insulating films 5a and 5b.

If the conductors 2 and 3 differ in potential, electric fields tend to concentrate in the vacant spaces 7a, 7b, 8a, and 8b. As a result, a partial discharge may occur. In order to suppress the occurrence of a partial discharge, with the insulated busbar 1 according to the embodiment the following method is adopted. Conductive films 9b and 9a which cover the vacant space 7a on the end portion 2c side are formed on inside surfaces of the insulating films 4a and 4b, respectively, so as to be in contact with the conductor 2. Furthermore, conductive films 9d and 9c which cover the vacant space 7b on the end portion 2d side are formed on the inside surfaces of the insulating films 4a and 4b, respectively, so as to be in contact with the conductor 2. The conductive films 9a through 9d are formed in contact with the conductor 2 so as to realize a contact resistance of, for example, 1Ω or less between the conductive films 9a through 9d and the conductor 2.

Furthermore, conductive films 10b and 10a which cover the vacant space 8a on the end portion 3c side are formed in the same way on inside surfaces of the insulating films 5a and 5b, respectively, so as to be in contact with the conductor 3. In addition, conductive films 10d and 10c which cover the vacant space 8b on the end portion 3d side are formed on inside surfaces of the insulating films 5a and 5b, respectively, so as to be in contact with the conductor 3. The conductive films 10a through 10d are formed in contact with the conductor 3 so as to realize a contact resistance of, for example, 1Ω or less between the conductive films 10a through 10d and the conductor 3.

Figure 14:
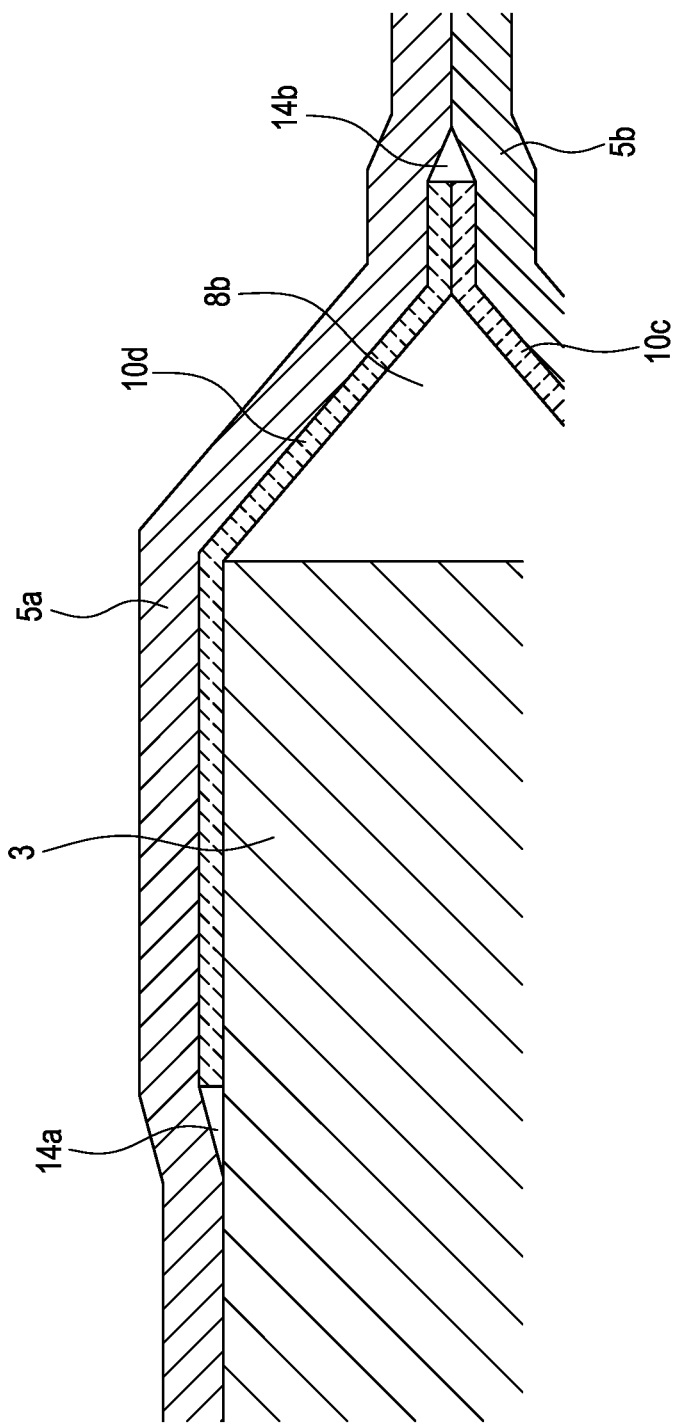
FIG. 14 is a sectional view illustrative of an example of an end portion of an insulated busbar according to an embodiment.

The conductive films 9a through 9d and 10a through 10d are metal, carbon films, or the like and have a sheet resistance (surface resistivity) of, for example, about several hundred ohms/sq or less. If the insulating films 4a, 4b, 5a, and 5b have adhesive layers in advance, then carbon powder or the like may be mixed into the adhesive layers to provide conductivity. As a result, the conductive films 9a through 9d and 10a through 10d are obtained. By doing so, the conductive films 9a through 9d and 10a through 10d are formed at a low cost. While the conductive films 10a through 10d appear in FIG. 1 to be embedded in the insulating films 5a and 5b, embodiments of the invention encompass conductive films formed on insulating films, as shown in FIG. 14. In FIG. 14, only a portion of FIG. 1 is shown for purposes of concise description, and reference numerals 14a and 14b represent gaps between the ends of the conductive films 10c and 10d, and the insulating films 5a and 5b. In the process of joining the insulating films 5a and 5b to each other and to the plate conductor 3, the insulating films 5a and 5b may conform to surround the conductive films 10a through 10d, at least in part. The same holds true for conductive films 9a through 9d and insulating films 4a and 4b.

The above conductive films 9a through 9d are in contact with the conductor 2. Accordingly, the conductive films 9a through 9d and the conductor 2 are equal in potential. As a result, the vacant space 7a is covered (enclosed) with the conductor 2 and the conductive films 9a and 9b which are equal in potential. The vacant space 7b is covered (enclosed) with the conductor 2 and the conductive films 9c and 9d which are equal in potential. Accordingly, a line of electric force generated between the conductors 2 and 3 does not extend to the vacant space 7a or 7b. This reduces electric field strength in the vacant spaces 7a and 7b and suppresses the occurrence of a partial discharge. Similarly, the conductive films 10a through 10d are in contact with the conductor 3. Accordingly, the conductive films 10a through 10d and the conductor 3 are equal in potential. As a result, the vacant space 8a is covered (enclosed) with the conductor 3 and the conductive films 10a and 10b which are equal in potential. The vacant space 8b is covered (enclosed) with the conductor 3 and the conductive films 10c and 10d which are equal in potential. This reduces electric field strength in the vacant spaces 8a and 8b and suppresses the occurrence of a partial discharge.

The electrical differences between the presence and absence of the above conductive films 9a through 9d and 10a through 10d will now be described.

Figure 3:
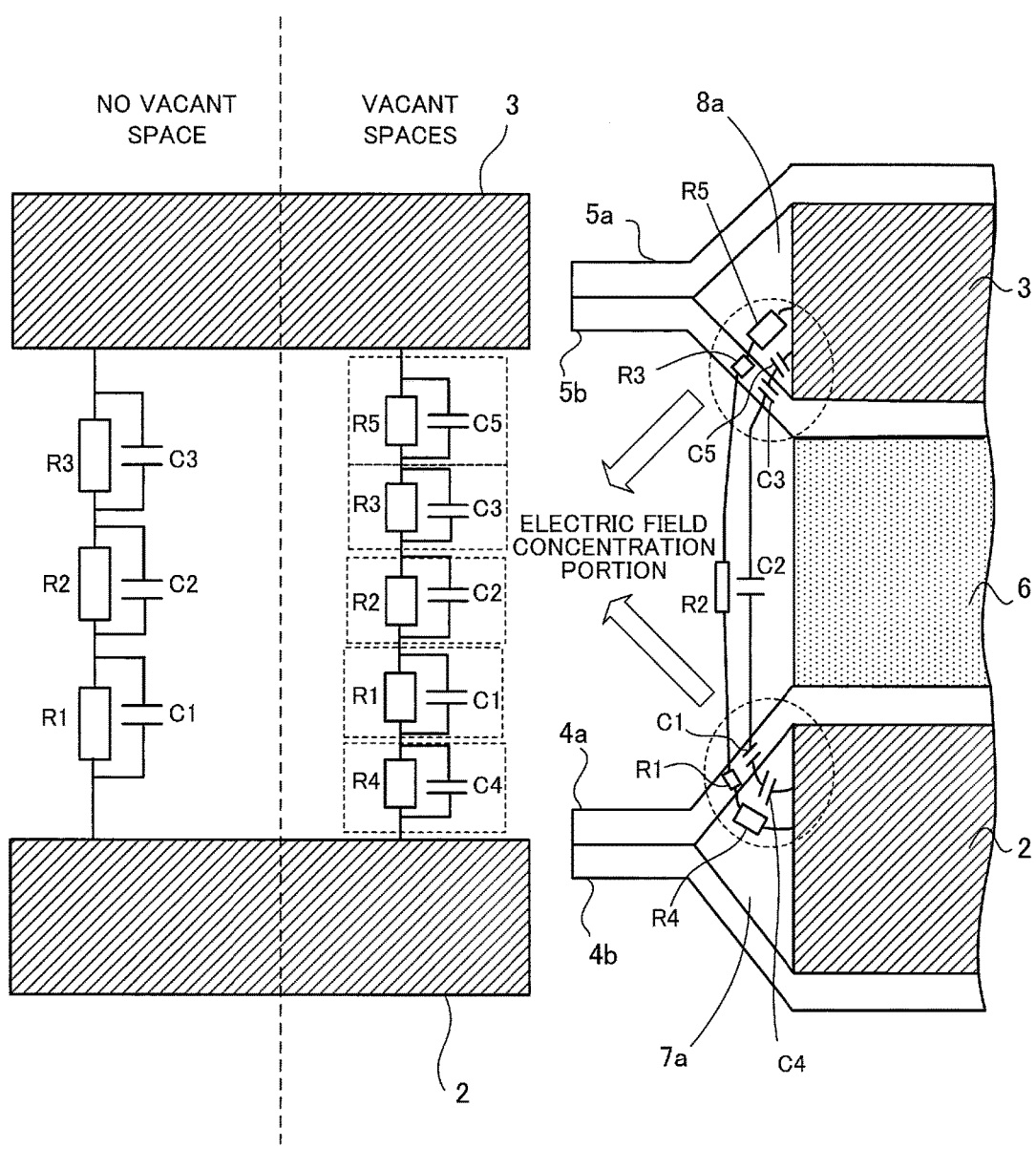
FIG. 3 illustrates part of an insulated busbar not including conductive films which cover a vacant space by an equivalent circuit.

FIG. 3 illustrates part of an insulated busbar not including conductive films which cover a vacant space by an equivalent circuit. For the sake of the simplicity of description a resistor or a capacitor in an adhesive layer will not be taken into consideration.

In FIG. 3, the insulating film 4a illustrated in FIG. 1 is indicated by a resistor R1 and a capacitor C1 connected in parallel with the resistor R1. Furthermore, in FIG. 3, the insulating plate 6 illustrated in FIG. 1 is indicated by a resistor R2 and a capacitor C2 connected in parallel with the resistor R2. In addition, in FIG. 3, the insulating film 5b illustrated in FIG. 1 is indicated by a resistor R3 and a capacitor C3 connected in parallel with the resistor R3.

If there is no vacant space between the conductors 2 and 3, then an area between the conductors 2 and 3 is represented by an equivalent circuit made up of the above resistors R1 through R3 and capacitors C1 through C3.

In FIG. 3, on the other hand, the vacant space 7a illustrated in FIG. 1 is indicated by a resistor R4 and a capacitor C4 connected in parallel with the resistor R4. Furthermore, in FIG. 3, the vacant space 8a illustrated in FIG. 1 is indicated by a resistor R5 and a capacitor C5 connected in parallel with the resistor R5.

If the above vacant spaces 7a and 8a are between the conductors 2 and 3, or in other words, if they form part of an electrical path between the conductors 2 and 3, then an area between the conductors 2 and 3 is represented by an equivalent circuit made up of the resistors R1 through R5 and the capacitors C1 through C5.

The capacitance values of the capacitors C4 and C5 are larger than those of the capacitors C1 through C3. Furthermore, the resistance values of the resistors R4 and R5 are those of air in the vacant spaces 7a and 8a.

The impedances Z4 and Z5 of the vacant spaces 7a and 8a are represented by the following expressions of combined impedance:

$$Z4=1/\{(1/r4)+j\omega c4\}$$

$$Z5=1/\{(1/r5)+j\omega c5\}$$

where r4 and r5 are the resistance values of the resistors R4 and R5, respectively, and c4 and c5 are the capacitance values of the capacitors C4 and C5 respectively. In this case, as the vacant spaces 7a and 8a become smaller, $j\omega c4 \gg 1/r4$ and $j\omega c4 \gg 1/r4$. That is to say, the impedances Z4 and Z5 largely depend on the capacitance values c4 and c5 of the vacant spaces 7a and 8a respectively. The distance between the insulating films 4a and 4b and the conductor 2 in the vacant space 7a and the distance between the insulating films 5a and 5b and the conductor 3 in the vacant space 8a are sufficiently short compared with the distance between the conductors 2 and 3. Therefore, the capacitance values c4 and c5 are large values.

In addition, electric fields are obtained by dividing voltages applied to the vacant spaces 7a and 8a by the distance between the insulating films 4a and 4b and the conductor 2 in the vacant space 7a and the distance between the insulating films 5a and 5b and the conductor 3 in the vacant space 8a. These distances are sufficiently short compared with the distance between the conductors 2 and 3. Therefore, if the conductors 2 and 3 differ in potential, then the electric fields are strong in the vacant spaces 7a and 8a. As illustrated in FIG. 3, for example, the electric fields concentrate in a portion on the conductor 3 side (on the upper side) of the vacant space 7a and in a portion on the conductor 2 side (on the lower side) of the vacant space 8a. The same applies to the vacant spaces 7b and 8b illustrated in FIG. 1.

Figure 4:
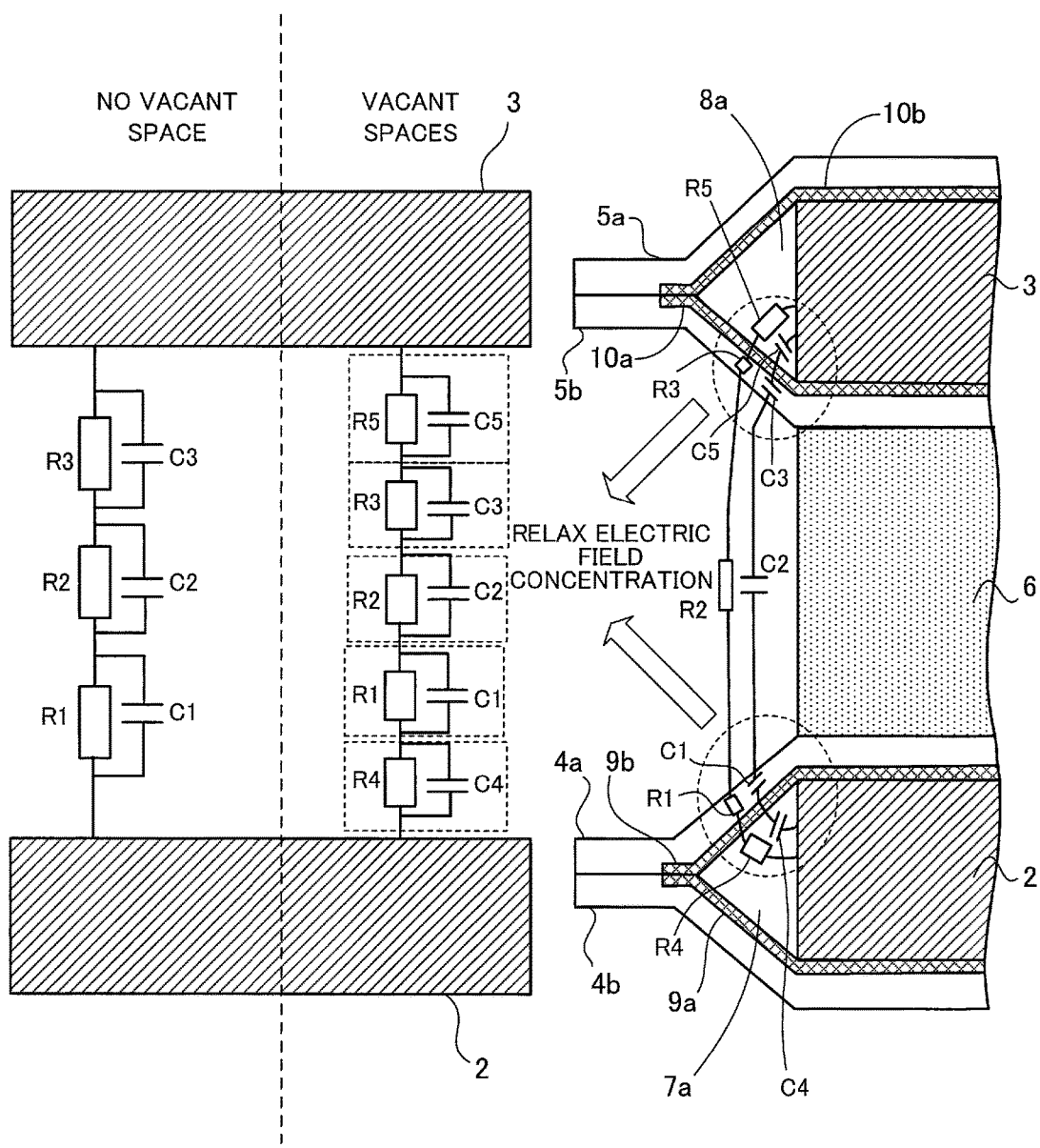
FIG. 4 illustrates part of an insulated busbar including conductive films which cover a vacant space by an equivalent circuit.

FIG. 4 illustrates part of an insulated busbar including conductive films which cover a vacant space by an equivalent circuit. Components in FIG. 4 which are the same as those illustrated in FIG. 3 are marked with the same numerals.

As illustrated in FIG. 4, if the conductive films 9a through 9d and 10a through 10d illustrated in FIG. 1 are formed, a node between resistors R1 and R4 connected in series are electrically connected to a conductor 2. Furthermore, a node between resistors R3 and R5 connected in series are electrically connected to a conductor 3. As a result, the resistors R4 and R5 and capacitors C4 and C5 are considered nonexistent. Accordingly, electric field concentration is relieved in vacant spaces 7a and 8a and the occurrence of a partial discharge is suppressed. Similarly, electric field concentration is also relieved in vacant spaces 7b and 8b and the occurrence of a partial discharge is suppressed.

As has been described in the foregoing, with the insulated busbar 1 according to the embodiment the occurrence of a partial discharge is suppressed. Accordingly, withstand voltage performance is improved and the insulated busbar 1 according to the embodiment accommodates products which need higher withstand voltages.

In addition, an increase in the thickness of an insulating material (insulating plate 6 illustrated in FIG. 1, for example) between the conductors 2 and 3 for the purpose of realizing a high withstand voltage is not performed. Accordingly, a low inductance characteristic is not lost. Conversely speaking, the insulated busbar 1 according to the embodiment has high withstand voltage performance. This makes it possible to reduce the thickness of the insulating material between the conductors 2 and 3 and therefore make inductance smaller. As a result, miniaturization of the insulated busbar 1 is expected.

In the example of FIG. 1, the conductive films 9a through 9d and 10a through 10d which cover all of the vacant space 7a left between the end portion 2c of the conductor 2 and the insulating films 4a and 4b, the vacant space 7b left between the end portion 2d of the conductor 2 and the insulating films 4a and 4b, the vacant space 8a left between the end portion 3c of the conductor 3 and the insulating films 5a and 5b, and the vacant space 8b left between the end portion 3d of the conductor 3 and the insulating films 5a and 5b are formed. However, the number of vacant spaces covered is not limited to four. Any one of them may be covered with conductive films.

Figure 5:
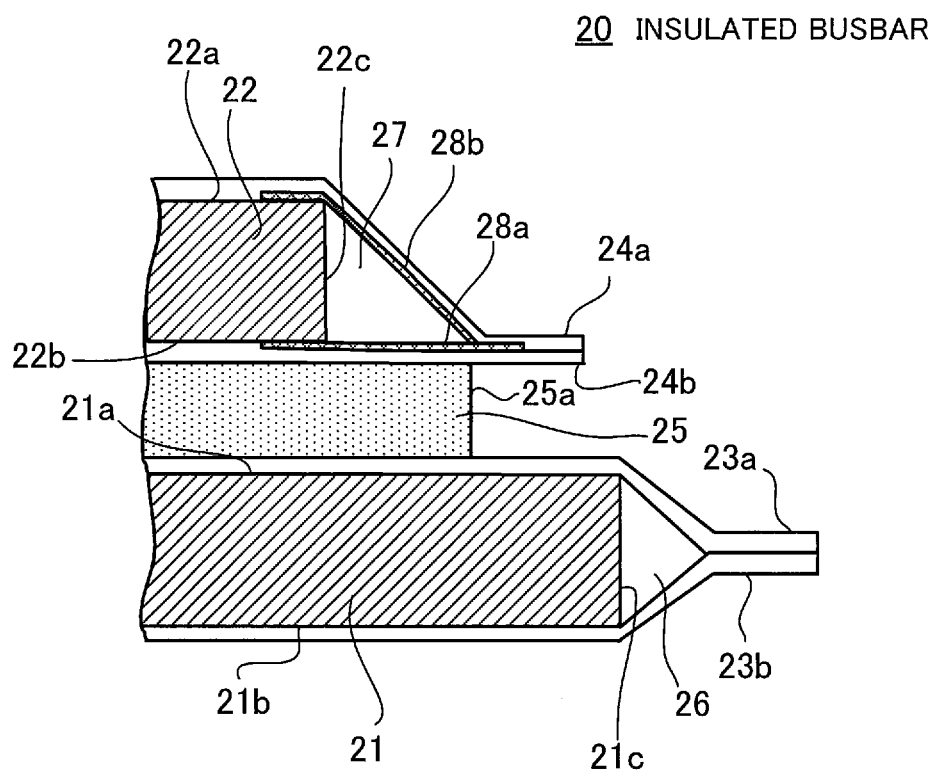
FIG. 5 is a sectional view illustrative of another example of an insulated busbar.

FIG. 5 is a sectional view illustrative of another example of an insulated busbar.

An insulated busbar 20 includes plate conductors 21 and 22. An upper surface 21a, an under surface 21b, and end portion 21c of the conductor 21 are covered with insulating films 23a and 23b. Similarly, an upper surface 22a, an under surface 22b, and end portion 22c of the conductor 22 are covered with insulating films 24a and 24b. The conductors 21 and 22 covered with the insulating films 23a and 23b and 24a and 24b, respectively, are stacked with an insulating plate 25 therebetween.

With the insulated busbar 20 illustrated in FIG. 5, there is a vacant space 26 between the end portion 21c of the conductor 21 and the insulating films 23a and 23b. Furthermore, there is a vacant space 27 between the end portion 22c of the conductor 22 and the insulating films 24a and 24b. The vacant space 26 is outside an end portion 25a of the insulating plate 25 and the vacant space 27 is inside the end portion 25a of the insulating plate 25. In other words, the end portion 22c, or edge, of the plate conductor 22 is located inward of the end portion 25a, or edge, of the insulating plate 25 in a width direction. The end portion 25a of the insulating plate 25 is located inward of the end portion 21c, or edge, of the plate conductor 21 in the width direction.

Of the vacant spaces 26 and 27 whose relative positions are indicated above, electric field concentration is more apt to occur in the vacant space 27. Accordingly, with the insulated busbar 20 conductive films are not formed on the insulating films 23a and 23b next to the vacant space 26. However, conductive films 28a and 28b are formed on the insulating films 24a and 24b next to the vacant space 27. In addition, the insulating film 24a may be formed to bend toward the insulating film 24b, while the insulating film 24b may extend straight along the surface of the insulating plate 25, without any bend toward the insulating film 24a. In such a configuration, one corner of the vacant space 27 may be defined by the insulating film 24b forming a right angle with the end portion 22c of the plate conductor 22.

Manufacturing processes or manufacturing costs are reduced by limiting in this way areas in which conductive films are formed.

(Example of Insulated Busbar Fabrication Method)

FIGS. 6 through 10 are perspective views illustrative of an example of an insulated busbar fabrication method.

Figure 6:
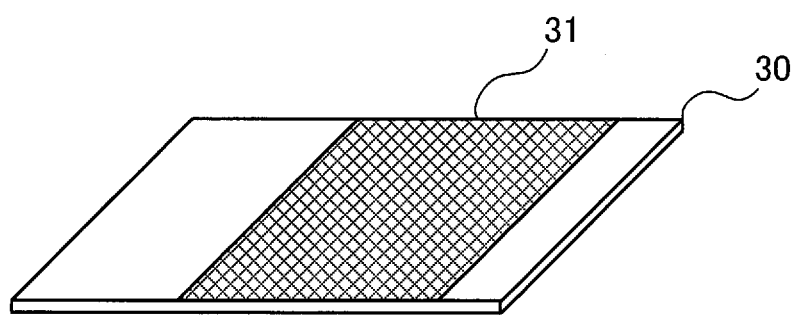
FIG. 6 is a perspective view illustrative of an example of an insulated busbar fabrication method (part 1).

First a conductive film 31 is formed over part of one surface of an insulating film 30 made of a material such as polypropylene or polyethylene terephthalate (FIG. 6). The conductive film 31 is formed by, for example, applying paint containing metal (such as silver (Ag)) or carbon with a spray or the like by the use of a mask.

If an adhesive layer is formed in advance over the insulating film 30, then carbon powder or the like may be mixed into part of the adhesive layer to provide conductivity. By doing so, the conductive film 31 is formed. The conductive film 31 is formed at a low cost by this method.

Furthermore, the conductive film 31 may be formed by plating or evaporation.

Figure 7:
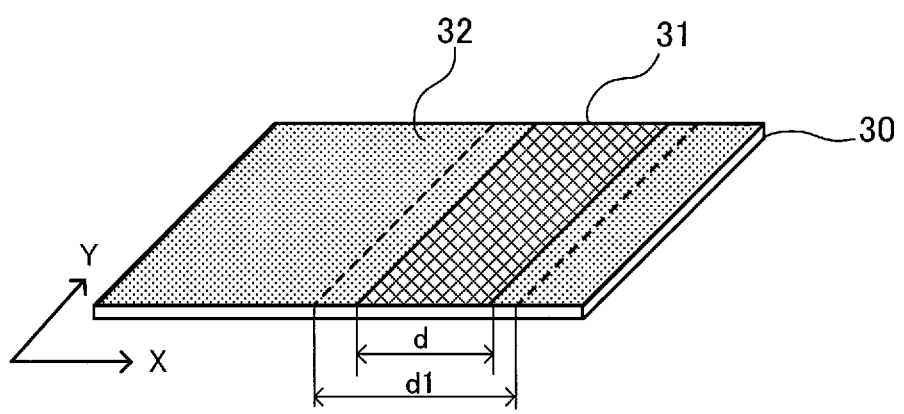
FIG. 7 is a perspective view illustrative of the example of the insulated busbar fabrication method (part 2).

If an adhesive layer is not formed in advance over the insulating film 30, then an adhesive layer 32 is formed as illustrated in FIG. 7 so as to cover the insulating film 30 and end portions of the conductive film 31. In the example of FIG. 7, the adhesive layer 32 is formed so as to cover end portions along two sides (extending in a Y direction) of the conductive film 31 whose length in an X direction is d1. As a result, the conductive film 31 is exposed by a length of d in the X direction. This adhesive layer 32 is formed by the use of a mask.

The adhesive layer 32 is formed so as to cover part of the conductive film 31 along its two sides. This prevents the conductive film 31 from peeling off the insulating film 30. The adhesive layer 32 may be formed so as to cover part of the conductive film 31 along its one side. This also prevents the conductive film 31 to some extent from peeling off the insulating film 30. Therefore, it is desirable to form the adhesive layer 32 so as to cover part of the conductive film 31 along at least one side of the conductive film 31.

The X direction is perpendicular to an end portion of a plate conductor to be disposed over the insulating film 30 in a subsequent process.

By the way, in an area in which the conductive film 31 illustrated in FIG. 7 is exposed, the length d of a side in the direction perpendicular to the end portion of the plate conductor to be disposed over the insulating film 30 in the subsequent process is determined on the basis of the thickness t of the conductor. The reason for this is that the size of a vacant space left changes according to the thickness t. As the thickness t increases, the size of a vacant space left increases.

Furthermore, the length d is determined on the basis of an angle formed between the end portion of the conductor and the conductive film 31 and an angle formed between the end portion of the conductor and a conductive film 36 illustrated in FIG. 11 and described later in the process of sticking together the insulating film 30 and an insulating film 34 illustrated in FIG. 11 and described later so that a vacant space left at the time of the thickness of the conductor being t will be covered with the conductive films 31 and 36.

In addition, the length d is determined on the basis of the sum of the length in the X direction of a portion of the conductive film 31 in contact with the plate conductor described later and the length in the X direction of an area in which the conductive film 36 illustrated in FIG. 11 and described later and the conductive film 31 contact.

If an adhesive layer is formed in advance over the insulating film 30, then the length d corresponds to the length, in the direction perpendicular to the end portion of the plate conductor to be disposed over the insulating film 30 in the subsequent process, of the side of the conductive film 31 formed over the adhesive layer.

Figure 8:
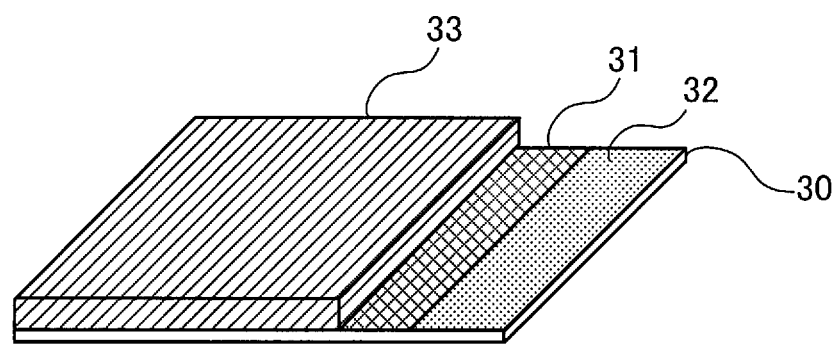
FIG. 8 is a perspective view illustrative of the example of the insulated busbar fabrication method (part 3).

As illustrated in FIG. 8, after that a plate conductor 33 is stuck over the insulating film 30 by the adhesive layer 32 so that it will come in contact with part of the exposed conductive film 31. The conductor 33 is a metal plate such as a copper plate. The conductor 33 may be stuck over the insulating film 30 by pressure bonding with the adhesive layer 32 therebetween.

Figure 9:
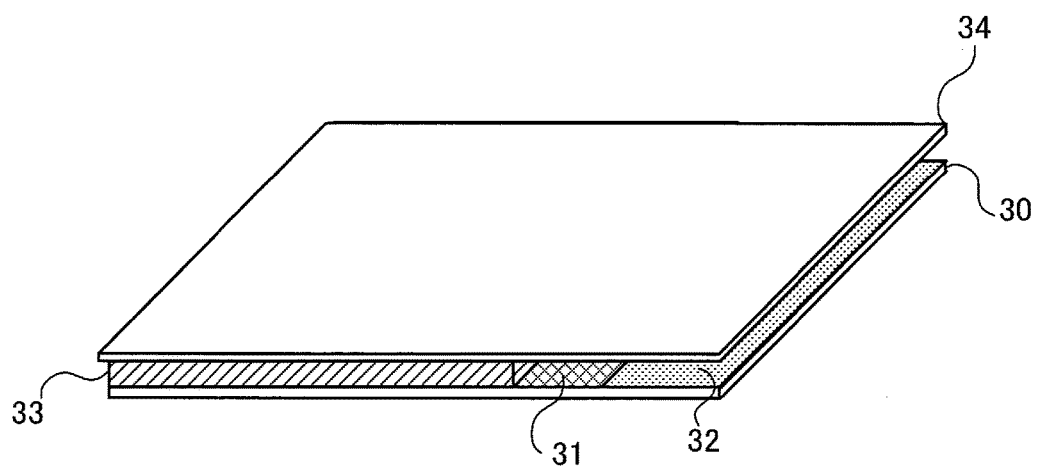
FIG. 9 is a perspective view illustrative of the example of the insulated busbar fabrication method (part 4).

As illustrated in FIG. 9, the insulating film 34 is then stuck over the conductor 33. A conductive film and an adhesive layer (not illustrated) are formed on an under surface of the insulating film 34 illustrated in FIG. 9 in positions which are the same as those in the structure illustrated in FIG. 7. The insulating film 34 is stuck over the conductor 33 with the adhesive layer (not illustrated) therebetween so that part of the conductive film will come in contact with the conductor 33.

Figure 10:
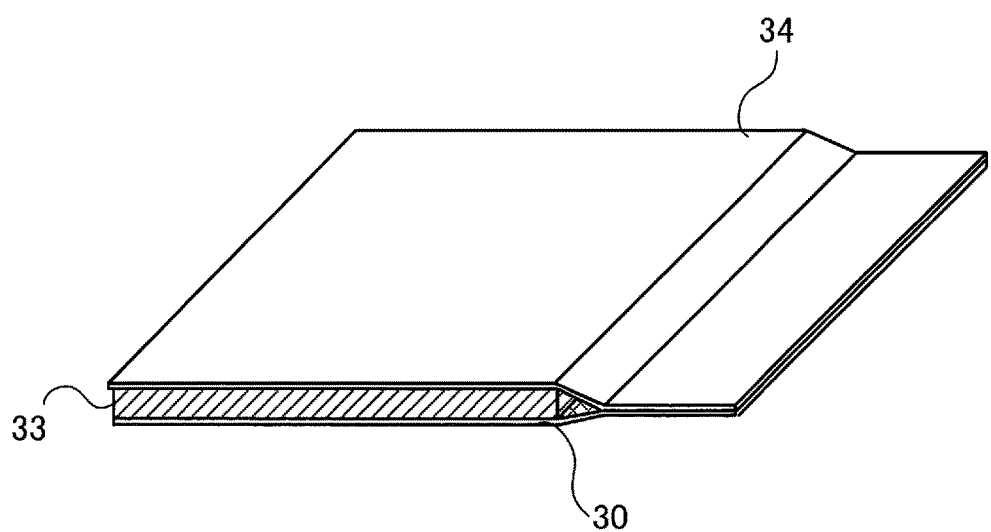
FIG. 10 is a perspective view illustrative of the example of the insulated busbar fabrication method (part 5).

After that, as illustrated in FIG. 10, the insulating films 30 and 34 are welded to the conductor 33 and the insulating films 30 and 34 are welded to each other, by hot pressing in a vacuum or under normal pressure at the melting temperature (about 200° C., for example) of a material used for forming the adhesive layer 32.

The insulating films 30 and 34 may be stuck together not by thermal pressing but by an adhesive.

The subsequent processes are not illustrated. However, a plurality of structures each of which is illustrated in FIG. 10 are glued together with an adhesive with an insulating plate (such as resin or a ceramic having a thickness of about several millimeters) therebetween to form an insulated busbar having a stacked structure (see FIG. 1).

Figure 11:
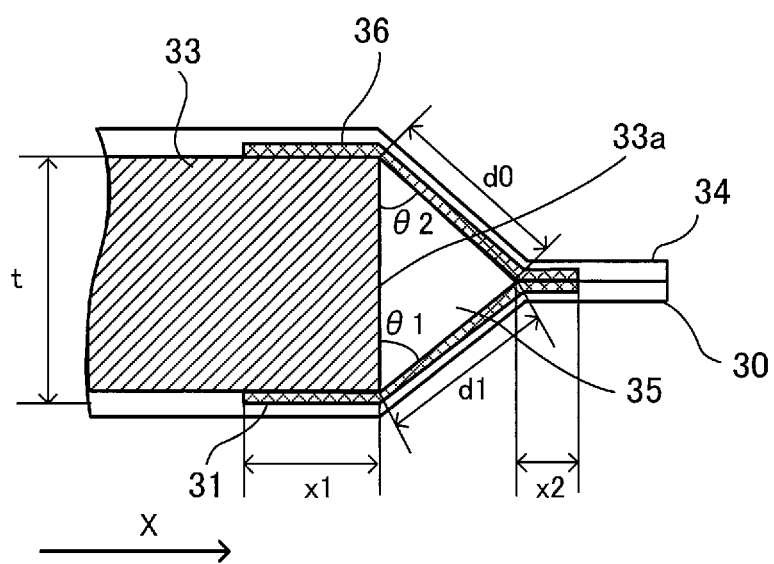
FIG. 11 is a sectional view illustrative of an example of a vacant space left between an end portion of a conductor and insulating films.

FIG. 11 is a sectional view illustrative of an example of a vacant space left between an end portion of a conductor and insulating films.

As illustrated in FIG. 11, a vacant space 35 is left between an end portion 33a of a conductor 33 and insulating films 30 and 34. An angle $\theta 1$ formed between the end portion 33a of the conductor 33 and a conductive film 31 and an angle $\theta 2$ formed between the end portion 33a of the conductor 33 and a conductive film 36 depend on manufacturing conditions and are in the range of, for example, 30 to 70 degrees.

The lengths d0 and d1 of two sides of the vacant space 35 are determined by the angles $\theta 1$ and $\theta 2$. For example, if the angles $\theta 1$ and $\theta 2$ are 45 degrees, then the lengths d0 and d1 are values obtained by multiplying 1/(square root of 2) and (thickness t) together. There are cases where the angles $\theta 1$ and $\theta 2$ differ. For example, if the angle $\theta 1$ is 90 degrees and the angle $\theta 2$ is 45 degrees, then the length d0 is a value obtained by multiplying (square root of 2) and (thickness t) together and the length d1 is equal to the thickness t.

The length d in the X direction of the area of the conductive film 31 illustrated in FIG. 7 which is not covered with the adhesive layer 32 is determined by a value obtained by adding the length x1 in the X direction of an area of the conductive film 31 in contact with the conductor 33 and the length x2 in the X direction of an area in which the conductive films 31 and 36 contact to the length d1 determined by the angles $\theta 1$ and $\theta 2$ with the above point taken into consideration. The length in the X direction of the conductive film 36 illustrated in FIG. 11 is also determined in the same way.

By determining the lengths in the X direction of the conductive films 31 and 36 in the above way, the vacant space 35 is covered with the conductive films 31 and 36.

As a result, the vacant space 35 is covered with the conductor 33 and the conductive films 31 and 36 which are equal in potential. This reduces electric field strength in the vacant space 35 and suppresses the occurrence of a partial discharge. Therefore, an insulated busbar having a high withstand voltage is fabricated.

Furthermore, the above insulated busbar fabrication method is realized without materially changing the conventional manufacturing processes or the design of an insulated busbar. Therefore, it is easy to incorporate the above insulated busbar fabrication method into the conventional manufacturing processes, and an increase in the manufacturing costs or production period is suppressed.

In the above fabrication method, the process for forming the conductive film 36 on the insulating film 34 may be performed right after the process for forming the conductive film 31 over the insulating film 30 or after the process for sticking the conductor 33 over the insulating film 30.

(Electronic Apparatus)

Figure 12:
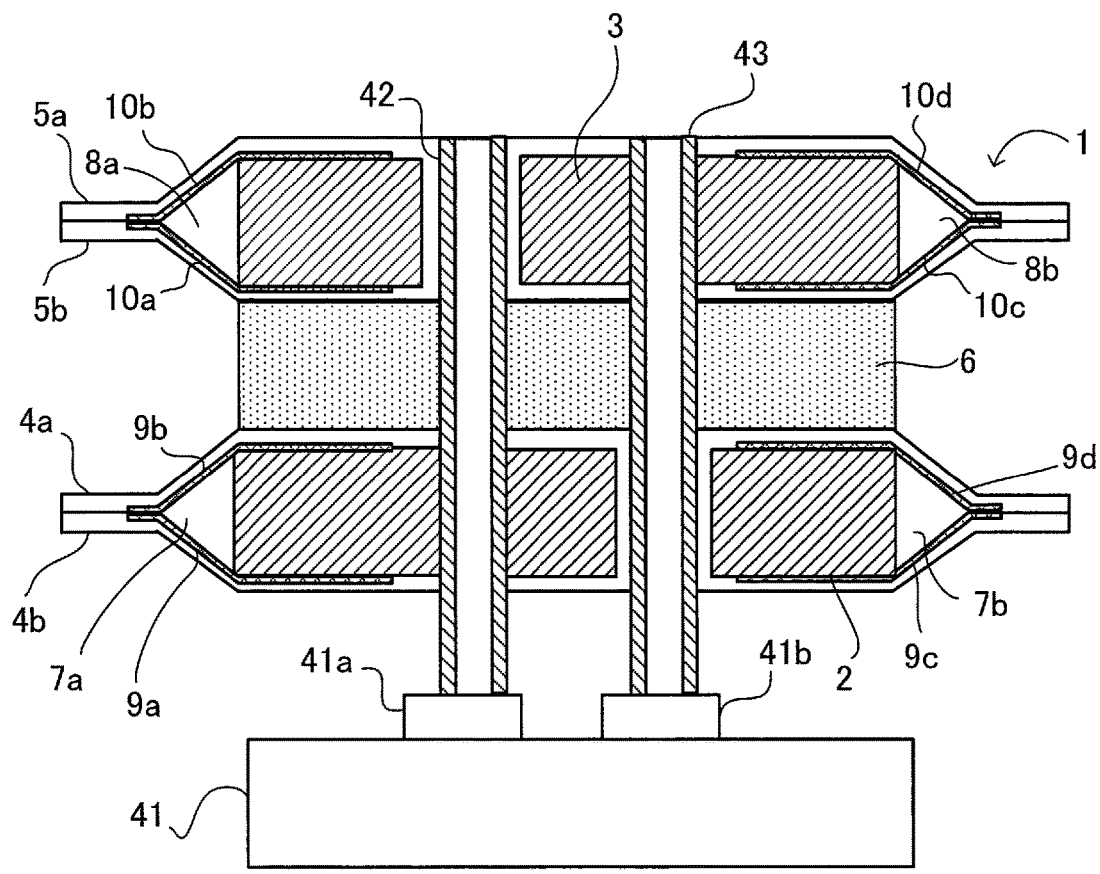
FIG. 12 is a sectional view illustrative of an example of part of an electronic apparatus using an insulated busbar.

FIG. 12 is a sectional view illustrative of an example of part of an electronic apparatus using an insulated busbar. Components in FIG. 12 which are the same as those illustrated in FIG. 1 are marked with the same numerals.

An electronic apparatus 40 is, for example, a power converter used for a railroad power supply.

The electronic apparatus 40 includes an insulated busbar 1 and a semiconductor element 41. For example, the semiconductor element 41 is a power semiconductor element such as a power metal-oxide semiconductor field effect transistor (MOSFET) or an insulated gate bipolar transistor (IGBT).

The semiconductor element 41 includes terminals 41a and 41b electrically connected to conductors 2 and 3, respectively, of the insulated busbar 1.

Feedthrough terminals 42 and 43 are formed in the insulated busbar 1. The feedthrough terminal 42 is electrically connected to the lower-layer conductor 2 and the feedthrough terminal 43 is electrically connected to the upper-layer conductor 3.

The terminal 41a is electrically connected to the conductor 2 via the feedthrough terminal 42 and the terminal 41b is electrically connected to the conductor 3 via the feedthrough terminal 43.

As stated above, the insulated busbar 1 suppresses the occurrence of a partial discharge in a vacant space 7a, 7b, 8a, or 8b in the above electronic apparatus 40. Therefore, the electronic apparatus 40 having a higher withstand voltage is provided.

(Modification)

Figure 13:
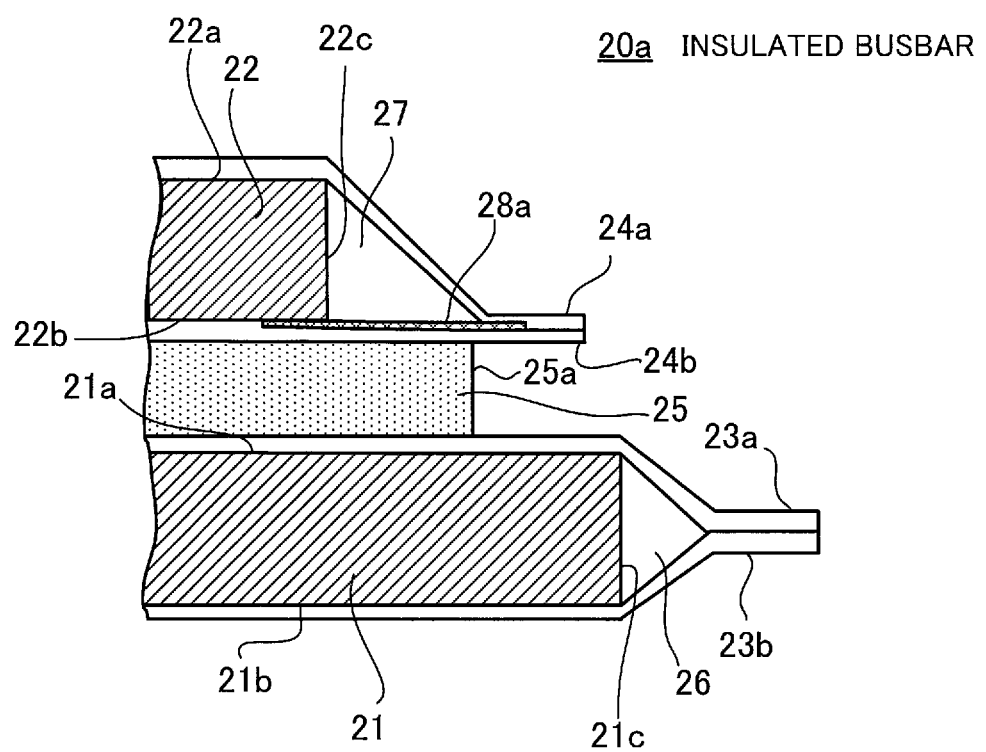
FIG. 13 is a sectional view illustrative of a modification of an insulated busbar.

FIG. 13 is a sectional view illustrative of a modification of an insulated busbar. Components in FIG. 13 which are the same as those illustrated in FIG. 5 are marked with the same numerals.

An insulated busbar 20a illustrated in FIG. 13 does not include the conductive film 28b illustrated in FIG. 5. The insulating film 24a does not include conductive film. In this case, a conductive film 28a covers an under surface of a vacant space 27. In other words, the conductive film 28a is formed on or in the insulating layer 24b between the Because insulating films 24a and 24b are stuck together, a vacant space is not left at an end portion of the conductive film 28a.

With the insulated busbar 20a the effect of suppressing the occurrence of a partial discharge is also expected.

According to the disclosed insulated busbar, insulated busbar fabrication method, and electronic apparatus, withstand voltage performance is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An insulated busbar comprising:
    a first plate conductor;
    first and second insulating films which cover opposite sides of the first plate conductor, the first and second insulating films having end portions extending past a first end of the first plate conductor and joining to form a vacant space defined by an end side of the first plate conductor and the end portions of the first and second insulating films; and
    a conductive film formed on an inside surface of the first insulating film so as to be in contact with the plate conductor and which covers a surface of the first insulating film defining the vacant space.

2. The insulated busbar according to claim 1, further comprising:
    a second plate conductor;
    third and fourth insulating films which cover opposite sides of the second plate conductor, the third and fourth insulating films having end portions extending past a first end of the second plate conductor and joining to form a vacant space defined by an end side of the second plate conductor and the end portions of the third and fourth insulating films; and
    an insulating plate between the first plate conductor and the second plate conductor, such that the first plate conductor, the insulating plate, and the second plate conductor are arranged in a stack.

3. The insulated busbar according to claim 2, wherein a first end of the first plate conductor is located inward from a first end of the insulating plate,
    the second insulating film covers a surface of the first plate conductor facing the insulating plate, the end portion of the first insulating film extending past the first end of the first plate conductor, and
    a portion of the second insulating film between the first end of the first plate conductor and the first end of the insulating plate defines one side of the vacant space and is covered with the conductive film.

4. The insulated busbar according to claim 3, wherein a portion of the second insulating film extending past the first end of the first plate conductor and defining another side of the vacant space is not covered by any conductive film.

5. The insulated busbar according to claim 1, wherein the conductive film covers an inside surface of the second insulating film defining a side of the vacant space.

6. An insulated busbar fabrication method comprising:
    forming a first conductive film over part of one surface of a first insulating film;
    forming a second conductive film over part of one surface of a second insulating film;
    sticking a plate conductor over the first insulating film with an adhesive so as to bring the plate conductor into contact with the first conductive film;
    sticking the second insulating film over the plate conductor with the adhesive so as to bring the second conductive film into contact with the plate conductor; and
    sticking the first insulating film and the second insulating film together, such that a first end of the plate conductor and end portions of the first insulating film and the second insulating film extending past the first end of the plate conductor form a vacant space, wherein the end portions of the first insulating film and the second insulating film that define the vacant space have the first conductive film and second conductive film formed thereon.

7. The insulated busbar fabrication method according to claim 6, wherein a length of a side, in a direction perpendicular to the end portion of the plate conductor, of the first conductive film or the second conductive film is determined on the basis of a thickness of the plate conductor.

8. The insulated busbar fabrication method according to claim 7, wherein the length of the side is determined on the basis of an angle between the first conductive film or the second conductive film and the end portion of the plate conductor at the time of sticking the first insulating film and the second insulating film together.

9. The insulated busbar fabrication method according to claim 7, wherein the length of the side is also determined on the basis of a length, in the direction perpendicular to the end portion of the plate conductor, of an area in which the first conductive film or the second conductive film is in contact with the plate conductor and a length, in the direction perpendicular to the end portion of the plate conductor, of an area in which the first conductive film and the second conductive film are in contact with each other.

10. The insulated busbar fabrication method according to claim 6, wherein at least part of at least one side of the first conductive film or the second conductive film is covered with the adhesive.

11. An electronic apparatus comprising:
  an insulated busbar including:
    a plate conductor;
    first and second insulating films which cover opposite sides of the plate conductor, the first and second insulating films having end portions extending past a first end of the plate conductor and joining to form a vacant space defined by an end side of the plate conductor and the end portions of the first and second insulating films; and
    a conductive film formed on an inside surface of at least one of the insulating films so as to be in contact with the plate conductor and which covers a surface of the first insulating film defining the vacant space; and
  a semiconductor element including a terminal electrically connected to the plate conductor via a feedthrough terminal.

* * * * *